United States Patent
Xu et al.

(10) Patent No.: US 12,320,883 B2
(45) Date of Patent: Jun. 3, 2025

(54) RESISTIVITY-BASED ADJUSTMENT OF THRESHOLDS FOR IN-SITU MONITORING

(71) Applicant: Applied Materials, Inc., Santa Clara, CA (US)

(72) Inventors: Kun Xu, Sunol, CA (US); Ingemar Carlsson, Milpitas, CA (US); Shih-Haur Shen, Sunnyvale, CA (US); Boguslaw A. Swedek, Morgan Hill, CA (US); Tzu-Yu Liu, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 742 days.

(21) Appl. No.: 17/508,814

(22) Filed: Oct. 22, 2021

(65) Prior Publication Data
US 2022/0043095 A1    Feb. 10, 2022

Related U.S. Application Data

(63) Continuation of application No. 15/867,372, filed on Jan. 10, 2018, now Pat. No. 11,199,605.
(Continued)

(51) Int. Cl.
*G01R 35/00* (2006.01)
*B24B 37/005* (2012.01)
(Continued)

(52) U.S. Cl.
CPC .......... *G01R 35/005* (2013.01); *B24B 37/005* (2013.01); *B24B 37/042* (2013.01); *C09G 1/00* (2013.01); *C09G 1/02* (2013.01)

(58) Field of Classification Search
USPC ....................................................... 702/104
See application file for complete search history.

(56) References Cited

U.S. PATENT DOCUMENTS

| | | |
|---|---|---|
| 6,924,641 B1 | 8/2005 | Hanawa et al. |
| 6,966,816 B2 | 11/2005 | Swedek et al. |

(Continued)

FOREIGN PATENT DOCUMENTS

| | | |
|---|---|---|
| CN | 1871504 | 11/2006 |
| CN | 102049732 | 5/2011 |

(Continued)

OTHER PUBLICATIONS

Office Action in Japanese Appln. No. 2019-537296, dated Dec. 21, 2021, 12 pages (with English translation).
(Continued)

*Primary Examiner* — Paul D Lee
(74) *Attorney, Agent, or Firm* — Fish & Richardson P.C.

(57) ABSTRACT

A first resistivity value and a correlation function relating thickness of a conductive layer having the first resistivity value to a signal from an in-situ monitoring system are stored. A second resistivity value for a conductive layer on a substrate is received. A sequence of signal values that depend on thickness of the conductive layer is received from an in-situ electromagnetic induction monitoring system that monitors the substrate during polishing. A sequence of thickness values is generated based on the sequence of signal values and the correlation function. For at least some thickness values of the sequence of thickness values adjusted thickness values are generated that compensate for variation between the first resistivity value and the second resistivity value to generate a sequence of adjusted thickness values. A polishing endpoint is detected or an adjustment for a polishing parameter is determined based on the sequence of adjusted thickness values.

19 Claims, 6 Drawing Sheets

Related U.S. Application Data

(60) Provisional application No. 62/562,976, filed on Sep. 25, 2017, provisional application No. 62/446,277, filed on Jan. 13, 2017.

(51) Int. Cl.
  *B24B 37/04* (2012.01)
  *C09G 1/00* (2006.01)
  *C09G 1/02* (2006.01)

(56) References Cited

U.S. PATENT DOCUMENTS

| | | |
|---|---|---|
| 6,975,107 B2 | 12/2005 | Hanawa et al. |
| 7,016,795 B2 | 3/2006 | Swedek et al. |
| 7,082,345 B2 | 7/2006 | Shanmugasundram et al. |
| 7,084,621 B2 | 8/2006 | Gotkis et al. |
| 7,097,537 B1 | 8/2006 | David et al. |
| 7,112,960 B2 | 9/2006 | Miller et al. |
| 7,153,185 B1 | 12/2006 | Birang et al. |
| 7,189,140 B1 | 3/2007 | Shugrue et al. |
| 7,682,221 B2 | 3/2010 | Swedek et al. |
| 8,010,222 B2 | 8/2011 | Lehman et al. |
| 8,408,965 B2 | 4/2013 | Bennett et al. |
| 9,528,814 B2 | 12/2016 | Nikolenko et al. |
| 11,079,459 B2 | 8/2021 | Xu et al. |
| 11,199,605 B2 | 12/2021 | Xu et al. |
| 2002/0103564 A1 | 8/2002 | Fielden et al. |
| 2002/0164925 A1 | 11/2002 | Swedek et al. |
| 2004/0119468 A1 | 6/2004 | Gotkis et al. |
| 2006/0214657 A1 | 9/2006 | Tada et al. |
| 2007/0061036 A1 | 3/2007 | Sakurai et al. |
| 2007/0103150 A1 | 5/2007 | Tada et al. |
| 2007/0205765 A1 | 9/2007 | Bailey |
| 2007/0251922 A1 | 11/2007 | Swedek et al. |
| 2008/0139087 A1 | 6/2008 | Togawa et al. |
| 2008/0156773 A1 | 7/2008 | Kitade et al. |
| 2008/0242195 A1 | 10/2008 | Heinrich et al. |
| 2008/0290865 A1 | 11/2008 | Fujita et al. |
| 2009/0023361 A1* | 1/2009 | Matsuzaki .......... B24B 49/105 451/41 |
| 2009/0104847 A1 | 4/2009 | Kobayashi et al. |
| 2009/0156098 A1 | 6/2009 | Swedek et al. |
| 2010/0099334 A1 | 4/2010 | Bennett et al. |
| 2011/0124269 A1 | 5/2011 | Tada et al. |
| 2011/0189925 A1 | 8/2011 | Iravani et al. |
| 2011/0318992 A1 | 12/2011 | David et al. |
| 2012/0034844 A1* | 2/2012 | Zhang .................. B24B 37/042 451/6 |
| 2012/0274318 A1* | 11/2012 | Ravid .................. G01B 7/105 324/239 |
| 2013/0211765 A1 | 8/2013 | Lu et al. |
| 2015/0017880 A1 | 1/2015 | Nomura et al. |
| 2015/0118765 A1 | 4/2015 | Xu et al. |
| 2015/0118766 A1 | 4/2015 | Xu et al. |
| 2015/0224623 A1 | 8/2015 | Xu et al. |
| 2015/0371907 A1 | 12/2015 | Lu et al. |
| 2016/0361791 A1 | 12/2016 | Economikos et al. |
| 2018/0203089 A1 | 7/2018 | Xu et al. |
| 2018/0203090 A1 | 7/2018 | Xu et al. |

FOREIGN PATENT DOCUMENTS

| | | |
|---|---|---|
| JP | 2006-128563 | 5/2006 |
| JP | 2007-109989 | 4/2007 |
| JP | 2008-004648 | 1/2008 |
| JP | 2008-288582 | 11/2008 |
| JP | 2009-099842 | 5/2009 |
| JP | 2011-023579 | 2/2011 |
| JP | 2012-506152 | 3/2012 |
| JP | 2015-172536 | 10/2015 |
| JP | 2016-087780 A | 5/2016 |
| KR | 10-2013-0018604 | 2/2013 |
| KR | 10-2016-0078473 | 7/2016 |
| KR | 10-2016-0119845 | 10/2016 |
| KR | 10-2018-0019576 | 2/2018 |
| TW | 200410298 | 6/2004 |
| TW | 201300733 | 1/2013 |
| WO | WO 1997/021070 | 6/1997 |
| WO | WO 2001/046684 | 6/1999 |
| WO | WO 2002/087825 | 11/2002 |
| WO | WO 2004/059242 | 7/2004 |

OTHER PUBLICATIONS

Office Action in Korean Appln. No. 10-2019-7023044, dated Apr. 22, 2022, 13 pages (with English translation).

International Search Report and Written Opinion in International Appln. No. PCT/US2018/013092, dated Apr. 27, 2018, 17 pages.

Wikipedia.org [online], "Eddy Current," Jan. 2017, retrieved on Aug. 18, 2020, retrieved from URL <https://en.wikipedia.org/w/index.php?title=Eddycurrent&oldid=759864696>.

Wikipedia.org [online], "Electrical Resistivity and Conductivity," 2017, retrieved on Aug. 18, 2020, retrieved from URL <https://en.wikipedia.org/w/index.php?title=Electrical resistivity and conductivity &oldid=799794460>, 16 pages.

Notice of Allowance in Korean Appln. No. 10-2019-7023044, dated Oct. 12, 2022, 17pages (with machine translation).

Office Action in Chinese Appln. No. 201880006844.3, dated Oct. 31, 2022, 13 pages (with English translation).

Yu et al., "Protein adsorption on poly (N-isopropylacrylamide)-modified silicon surfaces: effects of grafted layer thickness and protein size," Colloids and Surfaces B: Biointerfaces, Apr. 1, 2010, 76(2):468-74(abstract only).

Office Action in Japanese Appln. No. 2023-019103, dated Nov. 12, 2024, 6 pages (with English translation).

* cited by examiner

RESISTIVITY-BASED ADJUSTMENT OF THRESHOLDS FOR IN-SITU MONITORING

CROSS-REFERENCE TO RELATED APPLICATIONS

This application is a continuation of U.S. patent application Ser. No. 15/867,372, filed on Jan. 10, 2018, which claims priority to U.S. Provisional Application Ser. No. 62/446,277, filed on Jan. 13, 2017, and to U.S. Provisional Application Ser. No. 62/562,976, filed on Sep. 25, 2017, each of which is incorporated by reference.

TECHNICAL FIELD

The present disclosure relates to chemical mechanical polishing, and more specifically to monitoring of a conductive layer during chemical mechanical polishing.

BACKGROUND

An integrated circuit is typically formed on a substrate by the sequential deposition of conductive, semiconductive, or insulative layers on a silicon wafer. A variety of fabrication processes require planarization of a layer on the substrate. For example, one fabrication step involves depositing a filler layer over a non-planar surface and planarizing the filler layer. For certain applications, the filler layer is planarized until the top surface of a patterned layer is exposed. For example, a metal layer can be deposited on a patterned insulative layer to fill the trenches and holes in the insulative layer. After planarization, the remaining portions of the metal in the trenches and holes of the patterned layer form vias, plugs, and lines to provide conductive paths between thin film circuits on the substrate.

Chemical mechanical polishing (CMP) is one accepted method of planarization. This planarization method typically requires that the substrate be mounted on a carrier head. The exposed surface of the substrate is typically placed against a rotating polishing pad. The carrier head provides a controllable load on the substrate to push it against the polishing pad. Polishing slurry with abrasive particles is typically supplied to the surface of the polishing pad.

One problem in CMP is determining whether the polishing process is complete, i.e., whether a substrate layer has been planarized to a desired flatness or thickness, or when a desired amount of material has been removed. Variations in the slurry composition, the polishing pad condition, the relative speed between the polishing pad and the substrate, the initial thickness of the substrate layer, and the load on the substrate can cause variations in the material removal rate. These variations cause variations in the time needed to reach the polishing endpoint. Therefore, determining the polishing endpoint merely as a function of polishing time can lead to non-uniformity within a wafer or from wafer to wafer.

In some systems, a substrate is monitored in-situ during polishing, e.g., through the polishing pad. One monitoring technique is to induce an eddy current in the conductive layer and detect the change in the eddy current as the conductive layer is removed.

SUMMARY

In one aspect, a first resistivity value and a correlation function relating thickness of a conductive layer having the first resistivity value to a signal from an in-situ monitoring system are stored, a second resistivity value for a conductive layer on a substrate is received, a sequence of signal values that depend on thickness of the conductive layer is received from an in-situ electromagnetic induction monitoring system that monitors the substrate during polishing, a sequence of thickness values is generated based on the sequence of signal values and the correlation function, for at least some thickness values of the sequence of thickness values adjusted thickness values are generated that compensate for variation between the first resistivity value and the second resistivity value to generate a sequence of adjusted thickness values, a polishing endpoint is detected or an adjustment for a polishing parameter is determined based on the sequence of adjusted thickness values.

In another aspect, a first resistivity value and a correlation function relating thickness of a conductive layer having the first resistivity value to a signal from an in-situ electromagnetic induction monitoring system are stored, a second resistivity value and a sheet resistance for a conductive layer on a calibration substrate are received, a first signal value from the in-situ electromagnetic induction monitoring system is received that is measured when a sensor of the monitoring system is positioned to monitor the conductive layer of the calibration substrate and a second signal value from the in-situ electromagnetic induction monitoring system is received that is measured when the sensor of the monitoring system is not positioned to monitor the conductive layer, a threshold signal value is calculated from the correlation function based on the target thickness that compensates for variation between the first resistivity value and the second resistivity value, a sequence of signal values that depend on thickness of the conductive layer is received from the in-situ electromagnetic induction monitoring system that monitors the substrate during polishing, and a polishing endpoint is detected by comparing the sequence of signal values to the threshold value.

In another aspect, a first resistivity value and a correlation function relating thickness of a conductive layer having the first resistivity value to a signal from an in-situ monitoring system are stored, a second resistivity value and a sheet resistance value for a first conductive layer on a calibration substrate are received; a first signal value measurement of the first conductive layer on the calibration substrate is made using the in-situ electromagnetic induction monitoring system, a second signal value measurement is made without the first conductive layer using the in-situ electromagnetic induction monitoring system, and an offset and a gain to apply to signals from the in-situ electromagnetic induction monitoring system are calculated to compensate for variation in the in-situ electromagnetic induction monitoring system to compensate for variation between the first resistivity value and the second resistivity value.

In another aspect, a first resistivity value and a correlation function relating thickness of a conductive layer having the first resistivity value to a signal from an in-situ monitoring system are stored, a second resistivity value for a conductive layer on a substrate is received, the conductive layer on the substrate is polished, the conductive layer on the substrate is monitored during polishing with an in-situ electromagnetic induction monitoring system that generates a sequence of signal values that depend on thickness of the conductive layer, a sequence of thickness values is generated based on the sequence of signal values and the correlation function, for at least some thickness values of the sequence of thickness values adjusted thickness values are generated that compensate for variation between the first resistivity value and the second resistivity value to generate a sequence of adjusted thickness values, and a polishing endpoint is detected or an adjustment for a polishing parameter is determined based on the sequence of adjusted thickness values.

Each of these aspects can be applied as a method, as a computer program product, tangibly encoded on a non-transitory computer readable media, includes instructions to cause a computer system to carry out operations, or as a polishing system including a controller configured to carry out operations.

Implementations of the methods, the computer program products, and/or the systems may include one or more of the following features.

Adjusted thickness values may be generated by multiplying a thickness value by a ratio between the first resistivity value and the second resistivity value.

The adjusted thickness values may compensate for variation in temperature between a temperature at which the conductive layer has the second resistivity value and a temperature of the substrate during polishing. A first temperature may be stored and a measurement of a second temperature may be received from a polishing system. An adjusted second resistivity value may be calculated based on the second resistivity value, the first temperature and the second temperature. Calculating the adjusted resistivity value may include calculating a resistivity $\rho_T$ that satisfies $$\rho_T = \rho_X [1+\alpha(T_2-T_1)]$$

where $T_1$ is the first temperature, $T_2$ is the second temperature, $\rho_X$ is the second resistivity, and $\alpha$ is a resistivity temperature coefficient of the conductive layer.

The correlation function may satisfy $$S = W_1 \cdot D^2 + W_2 \cdot D + W_3$$

where S is the signal value, D is the thickness, and $W_1$, $W_2$, and $W_3$ are coefficients.

A third resistivity value may be received for a second conductive layer on a second substrate. A sequence of signal values that depend on thickness of the second conductive layer may be received from the in-situ electromagnetic induction monitoring system that monitors the second substrate during polishing. A sequence of adjusted signal values may be generated by applying the offset and gain to the signal values from the sequence of signal values. A sequence of thickness values may be generated based on the sequence of adjusted signal values and the correlation function. For at least some thickness values of the sequence of thickness values, adjusted thickness values may be generated that compensate for variation between the first resistivity value and the third resistivity value to generate a sequence of adjusted thickness values. A polishing endpoint may be detected or an adjustment for a polishing parameter may be determined based on the sequence of adjusted thickness values.

Applying the gain may include calculating an adjusted signal value S' that satisfies $$S' = G*S - \Delta K$$

where G is the gain and $\Delta K$ is the offset.

Calculating the gain G may satisfy $$G = (S_{DH} - S_{DL})/(S_1 - S_2)$$

where $S_1$ is the first signal value, $S_2$ is the second signal value, and $S_{DH}$ is a desired high signal value for the second conductive layer and $S_{DL}$ is a desired low signal value for the absence of the second conductive layer.

Calculating the desired high signal value $S_{DH}$ may satisfy $$S_{DH} = W_1 \cdot \left(\frac{\rho_0}{Rs_{CAL}}\right)^2 + W_2 \cdot \left(\frac{\rho_0}{Rs_{CAL}}\right) + W_3.$$

where $\rho_0$ is the first resistivity, $Rs_{CAL}$ is the sheet resistance value, and $W_1$, $W_2$ and $W_3$ are coefficients.

The conductive layer may include a conductive sheet and the monitoring system may generate an eddy current in the conductive sheet. The conductive layer may include conductive loops and the monitoring system may inductively generate a current in the conductive loops.

A temperature sensor may monitor a temperature associated with the conductive layer.

Implementations may include one or more of the following advantages. Possible inaccuracy of the correlation between a measured eddy current signal and a conductive layer thickness caused by variation in the resistivity of the conductive layer can be mitigated. An adjusted eddy current signal or an adjusted conductive layer thickness using the compensating processes can be more accurate. The adjusted eddy current signal and/or the adjusted conductive layer can be used for determining control parameters during a polishing process and/or determining an endpoint for the polishing process. Reliability of the control parameter determination and endpoint detection can be improved, wafer under-polish can be avoided, and within-wafer non-uniformity can be reduced.

The details of one or more implementations are set forth in the accompanying drawings and the description below. Other aspects, features, and advantages will be apparent from the description and drawings, and from the claims.

DETAILED DESCRIPTION

One monitoring technique for a polishing operation is to induce eddy currents in a conductive layer on a substrate, e.g., using an alternating current (AC) drive signal. The induced eddy currents can be measured by an eddy current sensor in-situ during polishing to generate a signal. Assuming the outermost layer undergoing polishing is a conductive layer, then the signal from the sensor should be dependent on the thickness of the conductive layer.

Based on the monitoring, control parameters for the polishing operation, such as polishing rate, can be adjusted in-situ. In addition, the polishing operation can terminate based on an indication that the monitored thickness has reached a desired endpoint thickness.

The accuracy of the correlation between the eddy current signals and the conductive layer thickness may be affected by various factors. One factor is the resistivity of the conductive layer. In particular, even for material of ostensibly the same composition (including both chemical composition and, e.g., crystalline structure), differences in fabrication process can result in differences in resistivity. For example, copper deposited by electroplating can have a different resistivity than copper deposited by vapor deposition. With other parameters, such as the structure of the eddy current system, being the same, the eddy current signals generated from the conductive layers having the same thickness will be different if the conductive layers have different resistivity.

Accordingly, the electromagnetic induction measurements, including the eddy current signals and the measured thicknesses based on the eddy current signals, are adjusted based on the resistivity of the conductive layer. Moreover, since the resistivity of the conductive layer can depend on the process that formed the conductive layer, compensating based simply on a textbook value for resistivity of a conductive material may not be sufficient.

In addition, due to variation in assembly, electromagnetic induction sensors can exhibit different gains and offsets. Therefore, an electromagnetic induction monitoring system may be calibrated to compensate for these variations, while also taking into account the resistivity of the layer on the substrate used for calibration.

Figure 1:
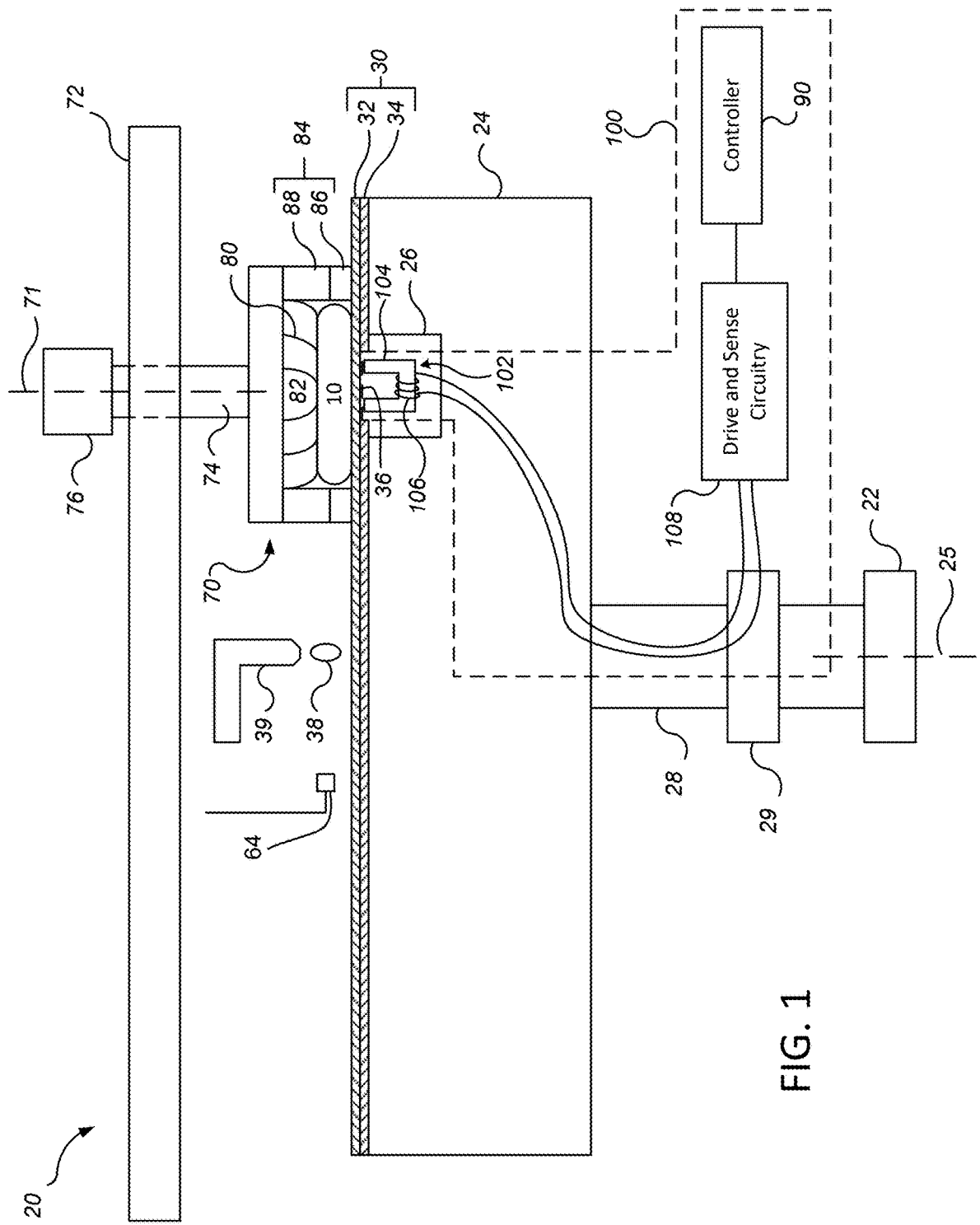
FIG. 1 illustrates a schematic cross-sectional view of an example of a polishing station including an electromagnetic induction monitoring system.
Figure 2:
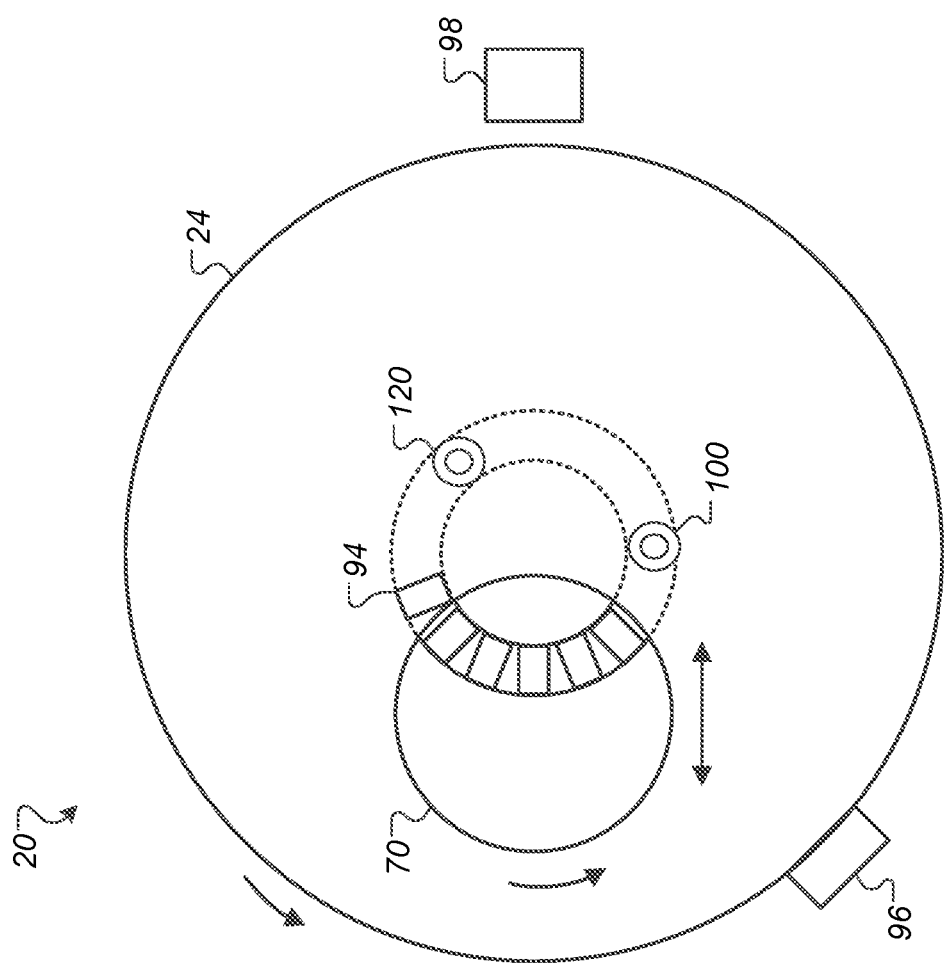
FIG. 2 illustrates a schematic top view of an example chemical mechanical polishing station showing a path of a sensor scan across a substrate.

FIGS. 1 and 2 illustrate an example of a polishing station 20 of a chemical mechanical polishing system. The polishing station 20 includes a rotatable disk-shaped platen 24 on which a polishing pad 30 is situated. The platen 24 is operable to rotate about an axis 25. For example, a motor 22 can turn a drive shaft 28 to rotate the platen 24. The polishing pad 30 can be a two-layer polishing pad with an outer polishing layer 34 and a softer backing layer 32.

The polishing station 20 can include a supply port or a combined supply-rinse arm 39 to dispense a polishing liquid 38, such as an abrasive slurry, onto the polishing pad 30. The polishing station 20 can include a pad conditioner apparatus with a conditioning disk to maintain the surface roughness of the polishing pad.

The carrier head 70 is operable to hold a substrate 10 against the polishing pad 30. The carrier head 70 is suspended from a support structure 72, e.g., a carousel or a track, and is connected by a drive shaft 74 to a carrier head rotation motor 76 so that the carrier head can rotate about an axis 71. Optionally, the carrier head 70 can oscillate laterally, e.g., on sliders on the carousel, by movement along the track, or by rotational oscillation of the carousel itself.

The carrier head 70 can include a retaining ring 84 to hold the substrate. In some implementations, the retaining ring 84 may include a highly conductive portion, e.g., the carrier ring can include a thin lower plastic portion 86 that contacts the polishing pad, and a thick upper conductive portion 88. In some implementations, the highly conductive portion is a metal, e.g., the same metal as the layer being polished, e.g., copper.

In operation, the platen is rotated about its central axis 25, and the carrier head is rotated about its central axis 71 and translated laterally across the top surface of the polishing pad 30. Where there are multiple carrier heads, each carrier head 70 can have independent control of its polishing parameters, for example each carrier head can independently control the pressure applied to each respective substrate.

The carrier head 70 can include a flexible membrane 80 having a substrate mounting surface to contact the back side of the substrate 10, and a plurality of pressurizable chambers 82 to apply different pressures to different zones, e.g., different radial zones, on the substrate 10. The carrier head can also include a retaining ring 84 to hold the substrate.

In some implementations, the polishing station 20 includes a temperature sensor 64 to monitor a temperature in the polishing station or a component of/in the polishing station. Although illustrated in FIG. 1 as positioned to monitor the temperature of the polishing pad 30 and/or slurry 38 on the pad 30, the temperature sensor 64 could be positioned inside the carrier head 70 to measure the temperature of the substrate 10. The temperature sensor 64 can be in direct contact (i.e., a contacting sensor) with the polishing pad or the outermost layer of the substrate 10, which can be a conductive layer, to accurately monitor the temperature of the polishing pad or the outmost layer of the substrate. The temperature sensor can also be a non-contacting sensor (e.g., an infrared sensor). In some implementations, multiple temperature sensors are included in the polishing station 20, e.g., to measure temperatures of different components of/in the polishing station. The temperature(s) can be measured in real time, e.g., periodically and/or in association with the real-time measurements made by the eddy current system. The monitored temperature(s) can be used in adjusting the eddy current measurements in-situ.

Figure 3A:
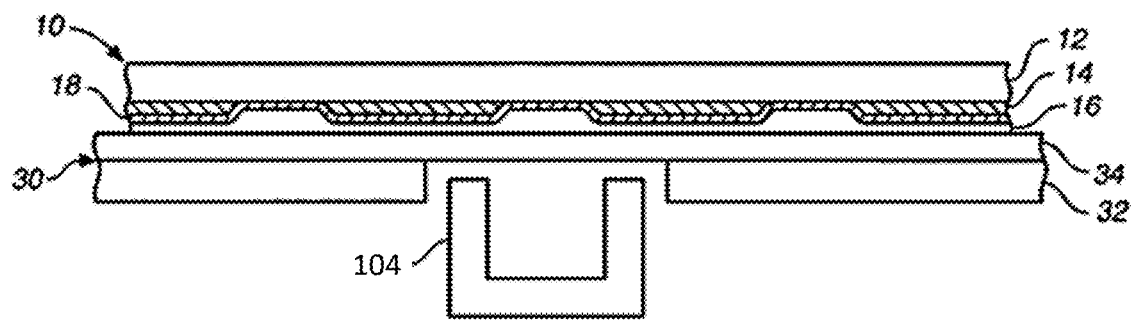
FIGS. 3A-3C are schematic cross-sectional views of a substrate illustrating a polishing process.

Referring to FIG. 3A, the polishing system can be used to polish a substrate 10 that includes a conductive material overlying and/or inlaid in a patterned dielectric layer. For example, the substrate 10 can include a layer of conductive material 16, e.g., a metal, e.g., copper, aluminum, cobalt or titanium, that overlies and fills trenches in a dielectric layer 14, e.g., silicon oxide or a high-k dielectric. Optionally a barrier layer 18, e.g., tantalum or tantalum nitride, can line the trenches and separate the conductive material 16 from the dielectric layer 14. The conductive material 16 in the trenches can provide vias, pads and/or interconnects in a completed integrated circuit. Although the dielectric layer 14 is illustrated as deposited directly on a semiconductor wafer 12, one or more other layers can be interposed between the dielectric layer 14 and the wafer 12.

Figure 3B:
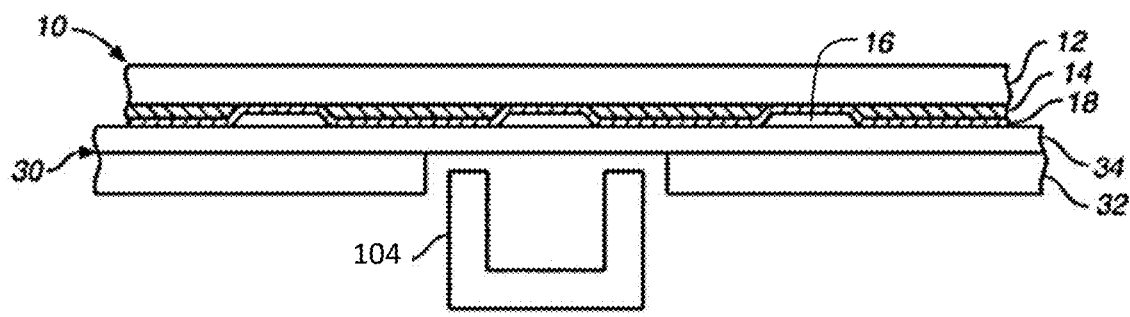
Figure 3C:
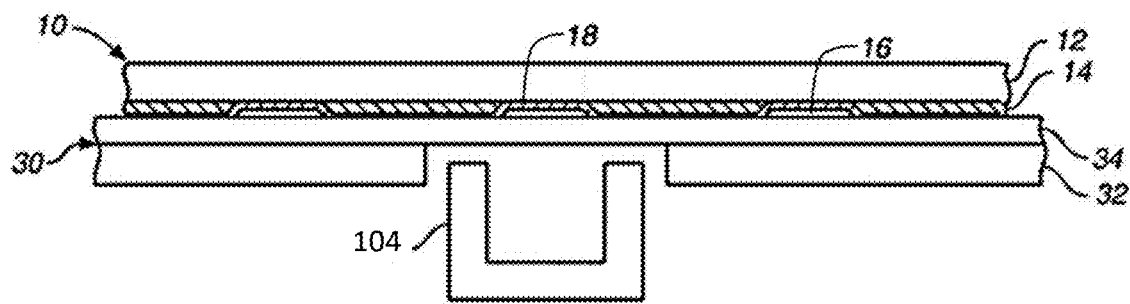

Initially, the conductive material 16 overlies the entire dielectric layer 14. As polishing progresses, the bulk of the conductive material 16 is removed, exposing the barrier layer 18 (see FIG. 3B). Continued polishing then exposes the patterned top surface of the dielectric layer 14 (see FIG. 3C). Additional polishing can then be used to control the depth of the trenches that contain the conductive material 16.

In some implementations, a polishing system includes additional polishing stations. For example, a polishing system can include two or three polishing stations. For example, the polishing system can include a first polishing station with a first electromagnetic induction monitoring system and a second polishing station with a second electromagnetic induction current monitoring system.

For example, in operation, bulk polishing of the conductive layer on the substrate can be performed at the first polishing station, and polishing can be halted when a target thickness of the conductive layer remains on the substrate. The substrate is then transferred to the second polishing station, and the substrate can be polished until an underlying layer, e.g., a patterned dielectric layer.

Returning to FIG. 1, the polishing system includes an in-situ electromagnetic induction monitoring system 100 which can be coupled to or be considered to include a controller 90. A rotary coupler 29 can be used to electrically connect components in the rotatable platen 24, e.g., the sensors of the in-situ monitoring systems, to components outside the platen, e.g., drive and sense circuitry or the controller 90.

The in-situ electromagnetic induction monitoring system 100 is configured to generate a signal that depends on a depth of the conductive material 16, e.g., the metal. The electromagnetic induction monitoring system can operate either by generation of eddy-currents in the conductive material, which can be either the sheet of conductive material that overlies the dielectric layer or the conductive material remaining in trenches after the dielectric layer is exposed, or generation of current in a conductive loop formed in a trench in the dielectric layer on the substrate.

In operation, the polishing system can use the in-situ monitoring system 100 to determine when the conductive layer has reached a target thickness, e.g., a target depth for metal in a trench or a target thickness for a metal layer overlying the dielectric layer, and then halts polishing. Alternatively or in addition, the polishing system can use the in-situ monitoring system 100 to determine differences in thickness of the conductive material 16 across the substrate 10, and use this information to adjust the pressure in one or more chambers 82 in the carrier head 80 during polishing in order to reduce polishing non-uniformity.

A recess 26 can be formed in the platen 24, and optionally a thin section 36 can be formed in the polishing pad 30 overlying the recess 26. The recess 26 and thin section 36 can be positioned such that regardless of the translational position of the carrier head they pass beneath substrate 10 during a portion of the platen rotation. Assuming that the polishing pad 30 is a two-layer pad, the thin section 36 can be constructed by removing a portion of the backing layer 32, and optionally by forming a recess in the bottom of the polishing layer 34. The thin section can optionally be optically transmissive, e.g., if an in-situ optical monitoring system is integrated into the platen 24.

The in-situ monitoring system 100 can include a sensor 102 installed in the recess 26. The sensor 102 can include a magnetic core 104 positioned at least partially in the recess 26, and at least one coil 106 wound around a portion of the core 104. Drive and sense circuitry 108 is electrically connected to the coil 106. The drive and sense circuitry 108 generates a signal that can be sent to the controller 90. Although illustrated as outside the platen 24, some or all of the drive and sense circuitry 108 can be installed in the platen 24.

Figure 4:
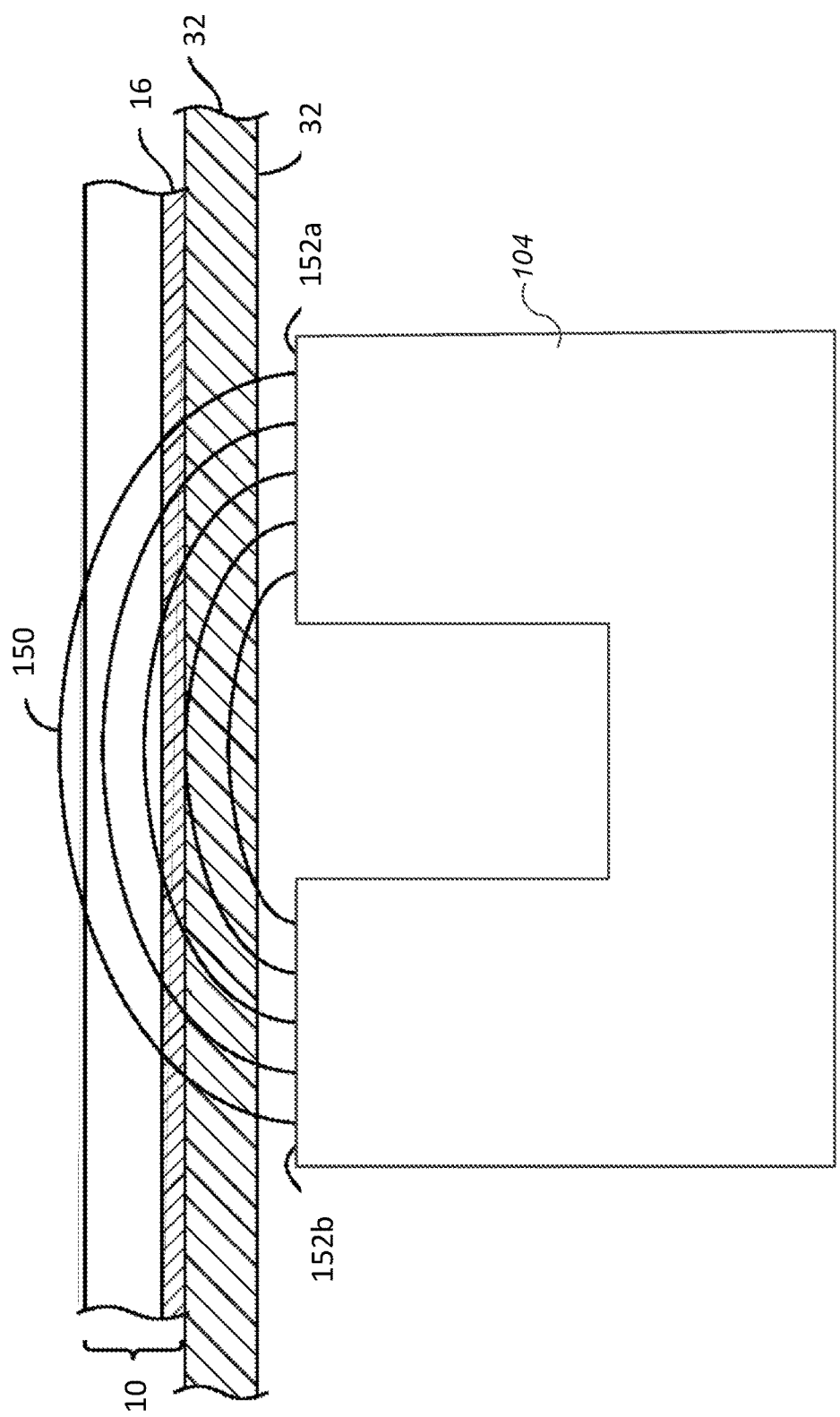
FIG. 4 is a schematic cross-sectional view illustrating an example magnetic field generated by an electromagnetic induction sensor.

Referring to FIGS. 1 and 4, the drive and sense circuitry 108 applies an AC current to the coil 106, which generates a magnetic field 150 between two poles 152a and 152b of the core 104. In operation, when the substrate 10 intermittently overlies the sensor 102, a portion of the magnetic field 150 extends into the substrate 10. The circuitry 108 can include a capacitor connected in parallel with the coil 106. Together the coil 106 and the capacitor can form an LC resonant tank.

If monitoring of the thickness of a conductive layer on the substrate is desired, then when the magnetic field 150 reaches the conductive layer, the magnetic field 150 can pass through and generate a current (if the target is a loop) or create an eddy-current (if the target is a sheet). This modifies the effective impedance the characteristic of the LC circuit.

The drive and sense circuitry 108 can include a marginal oscillator coupled to a combined drive/sense coil 106, and the output signal can be a current required to maintain the peak to peak amplitude of the sinusoidal oscillation at a constant value, e.g., as described in U.S. Pat. No. 7,112,960.

Other configurations are possible for the drive and sense circuitry 108. For example, separate drive and sense coils could be wound around the core. The drive and sense circuitry 108 can apply current at a fixed frequency, and the signal from the drive and sense circuitry 108 can be the phase shift of the current in the sense coil relative to the drive coil, or an amplitude of the sensed current, e.g., as described in U.S. Pat. No. 6,975,107.

Referring to FIG. 2, as the platen 24 rotates, the sensor 102 sweeps below the substrate 10. By sampling the signal from the circuitry 108 at a particular frequency, the circuitry 108 generates measurements at a sequence of sampling zones 94 across the substrate 10. For each sweep, measurements at one or more of the sampling zones 94 can be selected or combined. Thus, over multiple sweeps, the selected or combined measurements provide the time-varying sequence of values.

The polishing station 20 can also include a position sensor 96, such as an optical interrupter, to sense when the sensor 102 is underneath the substrate 10 and when the sensor 102 is off the substrate. For example, the position sensor 96 can be mounted at a fixed location opposite the carrier head 70. A flag 98 can be attached to the periphery of the platen 24. The point of attachment and length of the flag 98 is selected so that it can signal the position sensor 96 when the sensor 102 sweeps underneath the substrate 10.

Alternately or in addition, the polishing station 20 can include an encoder to determine the angular position of the platen 24.

Returning to FIG. 1, a controller 90, e.g., a general purpose programmable digital computer, receives the signals from sensor 102 of the in-situ monitoring system 100. Since the sensor 102 sweeps beneath the substrate 10 with each rotation of the platen 24, information on the depth of the conductive layer, e.g., the bulk layer or conductive material in the trenches, is accumulated in-situ (once per platen rotation). The controller 90 can be programmed to sample measurements from the in-situ monitoring system 100 when the substrate 10 generally overlies the sensor 102.

In addition, the controller 90 can be programmed to calculate the radial position of each measurement, and to sort the measurements into radial ranges. By arranging the measurements into radial ranges, the data on the conductive film thickness of each radial range can be fed into a controller (e.g., the controller 90) to adjust the polishing pressure profile applied by a carrier head. The controller 90 can also be programmed to apply endpoint detection logic to the sequence of measurements generated by the in-situ monitoring system 100 signals and detect a polishing endpoint.

Since the sensor 102 sweeps underneath the substrate 10 with each rotation of the platen 24, information on the conductive layer thickness is being accumulated in-situ and on a continuous real-time basis. During polishing, the measurements from the sensor 102 can be displayed on an output device to permit an operator of the polishing station to visually monitor the progress of the polishing operation.

As an eddy current monitoring system, the electromagnetic induction monitoring system 100 can be used to monitor the thickness of a conductive layer by inducing eddy currents in the conductive sheet, or to monitor the depth of a conductive material in a trench by inducing eddy currents in the conductive material. Alternatively, as an inductive monitoring system, the electromagnetic induction monitoring system can operate by inductively generating a current in a conductive loop formed in the dielectric layer 14 of the substrate 10 for the purpose of monitoring, e.g., as described in U.S. Patent Publication No. 2015/0371907.

Figure 5:
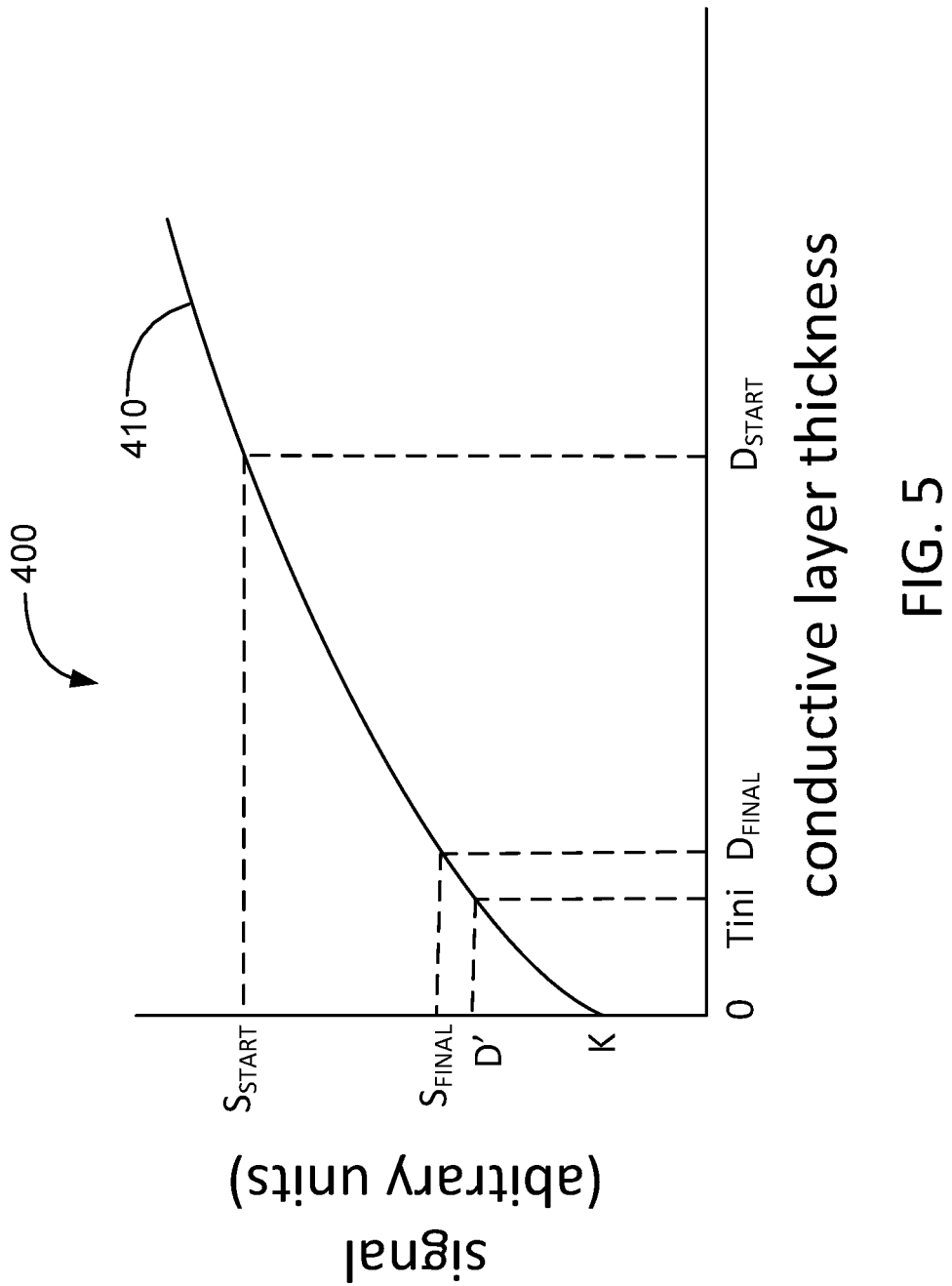
FIG. 5 illustrates a graph of an example eddy current phase signal as a function of conductive layer thickness.
Figure 6:
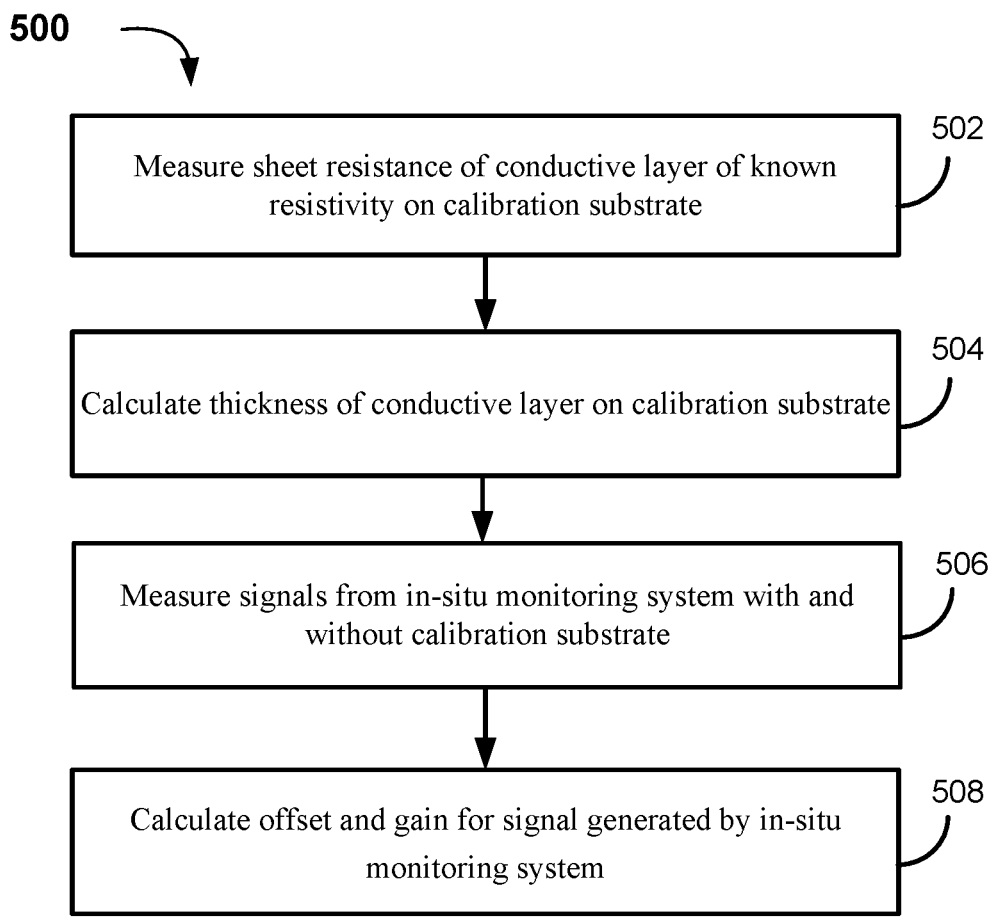
FIG. 6 is a flowchart showing an example process of calibrating an electromagnetic induction monitoring system taking into account variations of resistivity of the conductive layer in the calibration substrate.

FIG. 5 shows a graph 400 that illustrates a relationship curve 410, for a given resistivity, between the thickness of the conductive layer and the signal from the electromagnetic induction monitoring system 100. In the graph 400, $D_{START}$ represents the initial thickness of the conductive layer, $S_{START}$ is the desired signal value corresponding to the initial thickness $D_{START}$; $D_{FINAL}$ represents the final thickness of the conductive layer, and SFINAL is the desired signal value correspond to the final thickness; and K is a constant representing a value of the signal for zero conductive layer thickness. In addition to the reduction in layer thickness, substrate-to-substrate differences in resistivity in the conductive layer can modify the output signal from the sensor 102. In particular, a higher resistivity will increase sheet resistance of the conductive layer, causing the layer to appear thinner; conversely a lower resistivity will decrease sheet resistance of the conductive layer, causing the layer to appear thicker. An endpoint determined based an improper assumption for the value of the conductive layer can lead to the layer being under-polished or over-polished.

As noted above, since the resistivity of the conductive layer can depend on the process that formed the conductive layer, compensating based simply on a textbook value for resistivity of a conductive material may not provide sufficient accuracy. Thus, the controller 90 can be configured to receive a resistivity value and use that measurement to compensate for differences relative to the resistivity that was used to generate the relationship of the signal strength to layer thickness.

Due to slight differences in construction between sensors, as well as the possibility of changes in time, e.g., due to changes in polishing pad thickness, the electromagnetic induction monitoring system 100 can be calibrated before being used for polishing of substrates.

The relationship curve 410 can be represented in the controller 90 by a function, e.g., a polynomial function, e.g., a second order function, a third order function, or a higher order function. For example, the correlation between the signal S and the thickness D can be represented by the equation:

$$S = W_1 \cdot D^2 + W_2 \cdot D + W_3 \quad \text{(Equation 1)}$$

where $W_1$, $W_2$, and $W_3$ are real number coefficients. Thus, the controller can store the values of the coefficients of the function, e.g., $W_1$, $W_2$, and $W_3$, as well as the resistivity $\rho_0$ for which the relationship curve 410 applies. In addition, the relationship could be represented with a linear function, a Bezier curve, or a non-polynomial function, e.g., exponential or logarithmic.

Referring to FIG. 5, a method 500 of calibration begins with a user manufacturing a calibration substrate in which a relatively thick conductive layer, e.g., 2000 to 20000 Angstroms, has been formed by a fabrication process that the user knows provides a known resistivity $\rho_{CAL}$. This known resistivity, $\rho_{CAL}$ can be established during qualification of the manufacturing method, e.g., by other metrology systems.

The sheet resistance RscAL of the conductive layer on this calibration substrate is measured, e.g., using a four-point probe (step 502). The same four-point probe measurement can be used for all four-point probe measurements for calibration, and the measurement can be performed according to a standard, e.g., ASTM F390-11.

Next, the thickness of the conductive layer on the calibration substrate can be calculated (step 504). For example, the controller 90 may receive the resistivity $\rho_{CAL}$ and the measured sheet resistance $Rs_{CAL}$, e.g., by user input into a user interface or from a computer readable media. The controller can calculate a calibration thickness $D_{CAL}$, e.g., simply as $D_{CAL} = \rho_{CAL}/Rs_{CAL}$. Alternatively, the user can perform the calculation and enter just the resistivity $\rho_{CAL}$ and calibration thickness $D_{CAL}$ into the controller 90.

Next, two measurements are made using the in-situ metrology system 100 (step 506). The first measurement is performed with the carrier head holding the calibration substrate in place above the sensor 102; this generates a "measured high" first signal $S_{MH}$. The second measurement is performed with no substrate or carrier head over the sensor 102, e.g., the platen is rotated to a position such that the sensor 102 is not under the carrier head 70. This generates a "measured low" second signal $S_{ML}$. Alternatively, the second measurement can be performed when the sensor is under the carrier head 70 but there is no substrate held by the carrier head 70 or an entirely dielectric substrate is held by the carrier head 70.

Next, an offset and a gain can be calculated for the in-situ monitoring system 100 (step 508) so that the controller 90 can reliably perform thickness measurements.

The gain G can be calculated as $$G = (S_{DH} - S_{DL})/(S_{MH} - S_{ML})$$

where $S_{DH}$ is the "desired high" signal when the layer being polished as the same thickness as the conductive layer on the calibration substrate, and $S_{DL}$ is the "desired low" signal when the layer is removed.

The "desired low" signal can simply be a set value, e.g., 0 or 0.2 or 20%.

The "desired high" signal takes into account the variation of the resistivity of the conductive layer of the calibration substrate to the resistivity of the layer used for generation of the correlation function.

To calculate the "desired high" signal, the calculated thickness $D_{CAL}$ is multiplied by the ratio of the resistivity $\rho_0$ for which the relationship curve 410 applies to the known resistivity $\rho_{CAL}$ of the conductive layer of the calibration substrate to generate modified thickness, and the "desired high" signal value $S_{DH}$ is calculated from the relationship curve for this modified thickness. That is, $$S_{DH} = W_1 \cdot \left(D_{CAL} \frac{\rho_0}{\rho_{CAL}}\right)^2 + W_2 \cdot \left(D_{CAL} \frac{\rho_0}{\rho_{CAL}}\right) + W_3$$

It may be noted that the $1/Rs_{CAL}$ may be substituted for the value of $D_{CAL}/\rho_{CAL}$, although the values involved may be somewhat less intuitive and therefore more difficult to spot improperly entered data. But this would permit dispensing of calculation of the thickness of the conductive layer of the calibration substrate. As such, the calculation can be represented as $$S_{DH} = W_1 \cdot \left(\frac{\rho_0}{Rs_{CAL}}\right)^2 + W_2 \cdot \left(\frac{\rho_0}{Rs_{CAL}}\right) + W_3.$$

An offset $\Delta K$ can be calculated that satisfies:

$$\Delta K = G^* S_{ML} - S_{DL}$$

After calibration, a calibrated signal S' can be generated according to $$S' = G^*S - \Delta K \quad \text{(Equation 2)}$$

Thus, the gain and offset can be set such that if the in-situ monitoring system measures a substrate having a layer with the known resistivity $\rho_{CAL}$ and a predefined thickness, e.g., the calibration thickness, the in-situ monitoring system outputs the same desired high signal value $S_{DH}$.

To monitor the thickness of the conductive layer 16 during a polishing operation, the controller receives a measurement of the resistivity $\rho_X$ of the substrate 10 being polished. This resistivity $\rho_X$ can be the same as the calibration resistivity $\rho_{CAL}$, although it need not be.

A sequence of values S(t) for the signal are received over time from the in-situ monitoring system. Each value is normalized, e.g., using Equation 2 above, thus providing a sequence of calibrated values S'(t). Each calibrated value S'(t) can be used to calculate a thickness value D(t) using the correlation curve, thus providing a sequence of thickness values D(t). In addition, each thickness value can be adjusted based on the resistivity of the layer to provide a corrected thickness value, thus providing a sequence of corrected thickness values D'(t). The corrected thickness values can be calculated as follows:

$$D'(t)=D(t)*(\rho_X/\rho_0) \quad \text{(Equation 3)}$$

The corrected thickness values D'(t) can be used for control of the polishing parameters, e.g., for calculation of polishing pressures to reduce non-uniformity.

Endpoint can be called when the corrected thickness value D'(t) reaches a target thickness value $D_{TARGET}$.

Alternatively, an endpoint can be called when the calibrated values S'(t) reach a target trigger value $S_{TARGET}$. For example, $S_{TARGET}$ can be calculated as $$S_{TARGET} = W_1 \cdot \left(D_{TARGET}\frac{\rho_0}{\rho_X}\right)^2 + W_2 \cdot \left(D_{TARGET}\frac{\rho_0}{\rho_X}\right) + W_3 \quad \text{(Equation 4)}$$

The calibrated values S'(t) are compared to the target trigger value STARGET to determine the polishing endpoint.

In addition to the substrate-to-substrate variations in resistivity, changes in temperature of the layer can result in a change in the resistance of the conductive layer. For example, the conductive layer may become hotter as polishing progresses, and thus more conductive (lower resistivity). Accordingly, a measured thickness determined based on the signal from the electromagnetic induction monitoring system can become smaller than an actual thickness as the temperature of the conductive layer increases. In other words, as the temperature of a layer having the given thickness rises, the layer appears to be thinner. An endpoint determined based such measured thicknesses may lead to the layer being under polished, as the polishing process may stop at an actual thickness larger than the measured thickness.

The measured thickness determined based on the signal from the sensor 102 can be adjusted to be closer to the actual thickness, e.g., by compensating for the temperature variation of the conductive layer, and/or by compensating the measured thickness for the temperature variation of the conductive layer.

In particular, the controller carrying out the process 500 can also calculate a resistivity $\rho_T$ of the conductive layer at the real time temperature T(t). In some implementations, the adjusted resistivity $\rho_T$ is calculated based on the following equation:

$$\rho_T=\rho_X[1+\alpha(T(t)-T_{ini})]$$

where $T_{ini}$ is the initial temperature of the conductive layer when the polishing process starts. The adjusted resistivity $\rho_T$ is then used in place of the resistivity $\rho_X$, e.g., in Equations 3 and 4 above.

In situations where the polishing process is carried out under room temperature, $T_{ini}$ can take the approximate value of 20° C. $\rho_X$ is the resistivity of the conductive layer at $T_{ini}$, which can be room temperature. Typically, α is a known value that can be found in literature or can be obtained from experiment.

In some implementations, the temperatures T and $T_{ini}$ used in adjusting the measured eddy current signal are the temperature of the conductive layer, e.g., as measured by a temperature sensor in the carrier head. In some implementations, the temperatures T and $T_{ini}$ can be the temperatures of the polishing pad or the temperatures of the slurry instead of the temperatures of the conductive layer.

Without wishing to be bound by any particular theory, it is believed that a resistivity $\rho_T$ calculated using the temperatures of the polishing pad or slurry is similar to a resistivity $\rho_T$ calculated using the temperatures of the conductive layer, because the temperature differences are similar, and because α is also consistently determined using the pad or slurry temperature.

The above described polishing apparatus and methods can be applied in a variety of polishing systems. Either the polishing pad, or the carrier heads, or both can move to provide relative motion between the polishing surface and the substrate. For example, the platen may orbit rather than rotate. The polishing pad can be a circular (or some other shape) pad secured to the platen. Some aspects of the endpoint detection system may be applicable to linear polishing systems, e.g., where the polishing pad is a continuous or a reel-to-reel belt that moves linearly. The polishing layer can be a standard (for example, polyurethane with or without fillers) polishing material, a soft material, or a fixed-abrasive material. Terms of relative positioning are used; it should be understood that the polishing surface and substrate can be held in a vertical orientation or some other orientation.

Embodiments can be implemented as one or more computer program products, i.e., one or more computer programs tangibly embodied in a non-transitory machine readable storage media, for execution by, or to control the operation of, data processing apparatus, e.g., a programmable processor, a computer, or multiple processors or computers. A number of embodiments of the invention have been described. Nevertheless, it will be understood that various modifications may be made without departing from the spirit and scope of the invention. For example, more or fewer calibration parameters may be used. Additionally, calibration and/or drift compensation methods may be altered. Accordingly, other embodiments are within the scope of the following claims.

What is claimed is:

1. A computer program product, tangibly encoded on a non-transitory computer readable media, comprising instructions to cause a computer system to:

store a first resistivity value and a correlation function relating layer thickness of a conductive material having the first resistivity value at a temperature to a signal from an in-situ monitoring system, the first resistivity value generated from a textbook value or a measurement of a calibration substrate;

receive a second resistivity value for a deposited conductive layer of the conductive material at the temperature generated by a measurement of the deposited conductive layer on a device substrate to be polished;

receive a sequence of signal values that depend on thickness of the deposited conductive layer from an in-situ electromagnetic induction monitoring system that monitors the device substrate during polishing;

generate a sequence of thickness values based on the sequence of signal values and the correlation function;

calculate a threshold signal value from the correlation function based on a target thickness, wherein the threshold signal value compensates for variation between the first resistivity value and the second resistivity value;

detect a polishing endpoint by comparing the sequence of signal values to the threshold signal value; and in response to detecting the polishing endpoint, halt polishing at the polishing endpoint.

2. The computer program product of claim 1, wherein the instructions to calculate the threshold signal value comprise instructions to multiply the target thickness by a ratio between the first resistivity value and the second resistivity value.

3. The computer program product of claim 1, wherein the correlation function satisfies $$S = W_1 \cdot D^2 + W_2 \cdot D + W_3$$

where S is the signal value, D is the thickness, and $W_1$, $W_2$, and $W_3$ are coefficients.

4. The computer program product of claim 1, wherein the instructions to calculate the threshold signal value comprise instructions to compensate for variation in temperature between the temperature at which the conductive layer has the second resistivity value and a temperature of the substrate during polishing.

5. The computer program product of claim 1, comprising instructions to generate adjusted thickness values including instructions to compensate for variation in temperature between the temperature at which the deposited conductive layer has the second resistivity value and a temperature of the device substrate during polishing.

6. The computer program product of claim 5, comprising instructions to store a first temperature and to receive a measurement of a second temperature from a polishing system and wherein the instructions to compensate for variation in temperature comprise calculating an adjusted second resistivity value based on the second resistivity value, the first temperature and the second temperature.

7. A polishing method, comprising:

storing a first resistivity value and a correlation function relating layer thickness of a conductive material having the first resistivity value at a temperature to a signal from an in-situ monitoring system, the first resistivity value generated from a textbook value or a measurement of a calibration substrate;

receiving a second resistivity value for a deposited conductive layer of the conductive material at the temperature generated by a measurement of the deposited conductive layer on a device substrate to be polished;

receiving a sequence of signal values that depend on thickness of the deposited conductive layer from an in-situ electromagnetic induction monitoring system that monitors the device substrate during polishing;

generating a sequence of thickness values based on the sequence of signal values and the correlation function;

calculating a threshold signal value from the correlation function based on a target thickness, wherein the threshold signal value compensates for variation between the first resistivity value and the second resistivity value;

detecting a polishing endpoint by comparing the sequence of signal values to the threshold signal value; and in response to detecting the polishing endpoint, halt polishing at the polishing endpoint.

8. The method of claim 7, wherein the conductive layer comprises a conductive sheet and the monitoring system generates an eddy current in the conductive sheet.

9. The method of claim 7, wherein calculating the threshold signal value comprises multiplying the target thickness by a ratio between the first resistivity value and the second resistivity value.

10. The method of claim 7, wherein the correlation function satisfies $$S = W_1 \cdot D^2 + W_2 \cdot D + W_3$$

where S is the signal value, D is the thickness, and $W_1$, $W_2$, and $W_3$ are coefficients.

11. The method of claim 7, wherein calculating the threshold signal value comprises compensating for variation in temperature between the temperature at which the conductive layer has the second resistivity value and a temperature of the substrate during polishing.

12. The method of claim 7, comprising generating adjusted thickness values to compensate for variation in temperature between the temperature at which the deposited conductive layer has the second resistivity value and a temperature of the device substrate during polishing.

13. The method of claim 12, comprising storing a first temperature, receiving a measurement of a second temperature from a polishing system, and calculating an adjusted second resistivity value based on the second resistivity value, the first temperature and the second temperature.

14. A polishing system, comprising:

a rotatable platen to support a polishing pad;

a carrier head to hold a substrate against the polishing pad;

an in-situ electromagnetic induction monitoring system including a sensor to generate a sequence of signal values that depend on a thickness of a conductive layer on the substrate; and a controller configured to store a first resistivity value and a correlation function relating layer thickness of a conductive material having the first resistivity value at a temperature to a signal from an in-situ monitoring system, the first resistivity value generated from a textbook value or a measurement of a calibration substrate, receive a second resistivity value for a deposited conductive layer of the conductive material at the temperature generated by a measurement of the deposited conductive layer on a device substrate to be polished, receive a sequence of signal values that depend on thickness of the deposited conductive layer from the in-situ electromagnetic induction monitoring system, generate a sequence of thickness values based on the sequence of signal values and the correlation function, calculate a threshold signal value from the correlation function based on a target thickness, wherein the threshold signal value compensates for variation between the first resistivity value and the second resistivity value, detect a polishing endpoint by comparing the sequence of signal values to the threshold signal value, and in response to detecting the polishing endpoint, halt polishing at the polishing endpoint.

15. The system of claim 14, wherein the controller is configured to calculate the threshold signal value by multiplying the target thickness by a ratio between the first resistivity value and the second resistivity value.

16. The system of claim 14, comprising a temperature sensor to monitor a temperature associated with the conductive layer.

17. The system of claim 16, wherein the controller is configured to compensate for variation in temperature between a temperature at which the conductive layer has the second resistivity value and a temperature of the substrate during polishing by calculating the threshold signal value based on the variation in temperature.

18. The system of claim 16, wherein the controller is configured to compensate for variation in temperature between a temperature at which the conductive layer has the second resistivity value and a temperature of the substrate during polishing by generating the adjusted thickness values.

19. The system of claim 14, wherein the correlation function satisfies:

$$S = W_1 \cdot D^2 + W_2 \cdot D + W_3$$

where S is the signal value, D is the thickness, and $W_1$, $W_2$, and $W_3$ are coefficients.

* * * * *